United States Patent
Bioglio et al.

(10) Patent No.: US 10,541,710 B2
(45) Date of Patent: Jan. 21, 2020

(54) DEVICES AND METHODS IMPLEMENTING POLAR CODES

(71) Applicant: Huawei Technologies Co., Ltd., Shenzhen (CN)

(72) Inventors: Valerio Bioglio, Boulogne Billancourt (FR); Frederic Gabry, Munich (DE); Ingmar Land, Boulogne Billancourt (FR); Jean-Claude Belfiore, Boulogne Billancourt (FR)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/188,717

(22) Filed: Nov. 13, 2018

(65) Prior Publication Data

US 2019/0081646 A1 Mar. 14, 2019

Related U.S. Application Data

(63) Continuation of application No. PCT/EP2016/060730, filed on May 12, 2016.

(51) Int. Cl.
*H03M 13/00* (2006.01)
*H03M 13/13* (2006.01)
(Continued)

(52) U.S. Cl.
CPC ......... *H03M 13/618* (2013.01); *H03M 13/09* (2013.01); *H03M 13/13* (2013.01);
(Continued)

(58) Field of Classification Search
CPC ............ H03M 13/618; H03M 13/6362; H04L 1/0069; H04L 1/0041
(Continued)

(56) References Cited

U.S. PATENT DOCUMENTS 9,209,832 B2 12/2015 Alhussien et al.
10,193,578 B2 * 1/2019 Gross .................... H03M 13/09
(Continued)

FOREIGN PATENT DOCUMENTS

EP 2722993 A1 4/2014

OTHER PUBLICATIONS

Niu Kai et al:"Beyond turbo codes: Rate-compatible punctured polar codes", 2013 IEEE International Conference on Communications(ICC), Jun. 9, 2013, XP032522402, pp. 3423-3427.
(Continued)

*Primary Examiner* — Brian K Young

(74) *Attorney, Agent, or Firm* — Leydig, Voit & Mayer, Ltd.

(57) ABSTRACT

An encoder for encoding K information bits into a code word of length N' on the basis of a polar code of length N is provided, wherein N is a power of 2 and greater than or equal to N'. The encoder comprises a memory storing a plurality of bit indices, which comprise a set of N frozen bit indices associated with the polar code of length N, a set of N/2 puncturing bit indices and/or a set of N/2 shortening bit indices and a processor configured to retrieve at least a subset of the plurality of bit indices from the memory, to encode the K information bits using the polar code of length N for obtaining encoded data of length N and to reduce the number of bits of the encoded data to the length N' for obtaining the code word of length N'.

20 Claims, 15 Drawing Sheets

(51) Int. Cl.
*H03M 13/09* (2006.01)
*H04L 1/00* (2006.01)

(52) U.S. Cl.
CPC ..... *H03M 13/611* (2013.01); *H03M 13/6362* (2013.01); *H04L 1/0041* (2013.01); *H04L 1/0069* (2013.01)

(58) Field of Classification Search
USPC ............................................ 341/67, 87, 106
See application file for complete search history.

(56) References Cited

U.S. PATENT DOCUMENTS

| | | | | |
|---|---|---|---|---|
| 10,277,252 | B2* | 4/2019 | Nammi | H03M 13/13 |
| 10,312,946 | B2* | 6/2019 | Wang | H04L 1/0009 |
| 10,361,718 | B2* | 7/2019 | Jang | H03M 13/091 |
| 2015/0077277 | A1 | 3/2015 | Alhussien et al. | |

OTHER PUBLICATIONS

Ali Eslami et al: "A Practical Approach to Polar Codes", arxiv.org, Cornell University Library, 2010LIN Library Cornell University Ithaca, NY 14853, Jul. 27, 2011, XP080517802, 6 pages.

Huawei et al:"Overview of Polar Codes", 3GPP Draft;R1-162161, vol. RAN WG1, No. Busan, Korea;Apr. 11, 2016-Apr. 15, 2016, Apr. 2, 2016, XP051080007, 8 pages.

Eroz M et al:"On the design of prunable interleavers for turbo codes", Vehicular Technology Conference, 1999 IEEE 49th Houston, TX, USA May 16-20, 1999, vol . 2, May 16, 1999, pp. 1669-1673, XP010342111.

Gabi Sarkis et al:"Flexible and Low-Complexity Encoding and Decoding of Systematic Polar Codes", IEEE Transactions on Communications, Jan. 2016, pp. 2732-2745, XP055336370.

Li Yue et al:"A study of polar codes for MLC NAND flash memories", 2015 International Conference on Computing, Networking and Communications(ICNC)IEEE, Feb. 16, 2015, pp. 608-612, XP032752610.

Wang Runxin et al:"A Novel Puncturing Scheme for Polar Codes", IEEE Communications Letters, IEEE Service Center, vol. 18, No. 12, Dec. 2014, pp. 2081-2084, XP011567208.

Saber Hamid et al: "An Incremental Redundancy Hybrid ARQ Scheme via Puncturing and Extendig of Polar Codes", IEEE Transactions on Communications,vol. 63, No. 11, Nov. 2015, XP011589911, 10 pages.

Erdal Arikan et al, Channel Polarization: A Method for Constructing Capacity-Achieving Codes for Symmetric Binary-Input Memoryless Channels. IEEE Transactions on Information Theory ( vol. 55, Issue: 7 , Jul. 2009 ), 23 pages.

Ido Tal et al, List Decoding of Polar Codes. IEEE Transactions on Information Theory, vol. 61, No. 5, May 2015, 14 pages.

Kai Niu et al, CRC-Aided Decoding of Polar Codes. IEEE Communications Letters, vol. 16, No. 10, Oct. 2012, 4 pages.

Liang Zhang et al, On the Puncturing Patterns for Punctured Polar Codes. 2014 IEEE International Symposium on Information Theory (ISIT), Jun. 2014, 5 pages.

Dong-Min Shin et al, Design of Length-Compatible Polar Codes Based on the Reduction of Polarizing Matrices. IEEE on Communications, vol. 61, No. 7, Jul. 2013, 7 pages.

Vera Miloslayskaya, Shortened Polar Codes. IEEE Transactions on Information Theory, vol. 61, No. 9, Sep. 2015, 14 pages.

\* cited by examiner

Set of frozen bit indices

Fig. 9

| | | | | | Set of puncturing bit indices | | | | | | | |
|---|---|---|---|---|---|---|---|---|---|---|---|---|
| 73 | 385 | 321 | 289 | 265 | 257 | 193 | 161 | 145 | 137 | 133 | 129 | 81 | 65 |
| 33 | 9 | 3 | 1 | 97 | 49 | 41 | 17 | 5 | 273 | 261 | 69 | 25 | 2 |
| 37 | 21 | 259 | 449 | 131 | 417 | 353 | 67 | 401 | 225 | 337 | 209 | 35 | 305 |
| 393 | 177 | 13 | 329 | 201 | 113 | 297 | 169 | 19 | 105 | 389 | 258 | 281 | 325 |
| 130 | 153 | 197 | 293 | 66 | 89 | 165 | 101 | 11 | 277 | 34 | 57 | 149 | 387 |
| 323 | 481 | 85 | 195 | 465 | 291 | 433 | 269 | 18 | 163 | 457 | 369 | 141 | 53 |
| 425 | 241 | 99 | 7 | 275 | 361 | 77 | 147 | 386 | 409 | 233 | 453 | 322 | 345 |
| 421 | 10 | 83 | 45 | 194 | 217 | 357 | 267 | 290 | 313 | 405 | 229 | 139 | 162 |
| 185 | 51 | 341 | 451 | 29 | 213 | 75 | 274 | 419 | 98 | 121 | 6 | 397 | 309 |
| 497 | 146 | 355 | 263 | 333 | 181 | 403 | 43 | 489 | 227 | 135 | 82 | 205 | 266 |
| 339 | 117 | 301 | 450 | 473 | 71 | 4 | 138 | 211 | 485 | 173 | 395 | 27 | 418 |
| 50 | 441 | 307 | 285 | 74 | 469 | 39 | 331 | 354 | 377 | 179 | 109 | 262 | 402 |
| 157 | 203 | 226 | 249 | 437 | 134 | 42 | 115 | 299 | 483 | 391 | 23 | 338 | 461 |
| 93 | 373 | 171 | 70 | 327 | 260 | 210 | 26 | 394 | 467 | 429 | 15 | 283 | 245 |
| 306 | 61 | 107 | 199 | 132 | 38 | 330 | 295 | 155 | 178 | 435 | 365 | 68 | 22 |
| 413 | 202 | 167 | 459 | 91 | 482 | 505 | 237 | 114 | 390 | 298 | 371 | 279 | 36 |
| 103 | 14 | 349 | 59 | 170 | 243 | 427 | 326 | 151 | 20 | 466 | 221 | 282 | 106 |
| 271 | 501 | 198 | 87 | 317 | 363 | 455 | 12 | 154 | 388 | 294 | 143 | 189 | 55 |
| 411 | 434 | 235 | 90 | | | | | | | | | | |

Fig. 10

Set of shortening bit indices

| 512 | 256 | 384 | 448 | 480 | 496 | 504 | 508 | 510 | 511 | 128 | 192 | 320 | 224 |
|---|---|---|---|---|---|---|---|---|---|---|---|---|---|
| 352 | 416 | 240 | 368 | 432 | 464 | 248 | 376 | 440 | 472 | 488 | 252 | 380 | 444 |
| 476 | 492 | 254 | 382 | 446 | 500 | 478 | 494 | 502 | 255 | 383 | 447 | 64 | 96 |
| 160 | 112 | 288 | 479 | 176 | 304 | 208 | 120 | 336 | 184 | 312 | 400 | 216 | 495 |
| 344 | 408 | 506 | 232 | 124 | 360 | 188 | 316 | 424 | 220 | 348 | 412 | 456 | 236 |
| 364 | 503 | 428 | 126 | 460 | 190 | 244 | 318 | 372 | 222 | 350 | 436 | 414 | 238 |
| 366 | 468 | 430 | 507 | 462 | 246 | 374 | 484 | 127 | 438 | 191 | 319 | 32 | 223 |
| 48 | 351 | 470 | 80 | 56 | 144 | 415 | 239 | 88 | 272 | 367 | 152 | 250 | 104 |
| 280 | 378 | 60 | 431 | 168 | 92 | 296 | 442 | 486 | 156 | 200 | 108 | 284 | 328 |
| 509 | 247 | 463 | 172 | 375 | 300 | 392 | 474 | 204 | 62 | 439 | 116 | 332 | 94 |
| 180 | 158 | 308 | 396 | 110 | 286 | 212 | 471 | 174 | 340 | 490 | 302 | 251 | 206 |
| 404 | 379 | 118 | 228 | 334 | 182 | 356 | 63 | 443 | 310 | 398 | 487 | 95 | 214 |
| 420 | 159 | 342 | 16 | 111 | 287 | 498 | 24 | 475 | 122 | 175 | 406 | 40 | 186 |
| 230 | 452 | 303 | 28 | 72 | 253 | 314 | 358 | 207 | 119 | 44 | 136 | 381 | 218 |
| 335 | 183 | 76 | 264 | 422 | 346 | 491 | 311 | 445 | 52 | 140 | 30 | 399 | 215 |
| 84 | 410 | 268 | 234 | 46 | 343 | 454 | 148 | 123 | 362 | 78 | 477 | 100 | 276 |
| 187 | 54 | 142 | 407 | 231 | 164 | 499 | 426 | 315 | 86 | 270 | 359 | 31 | 242 |
| 292 | 219 | 150 | 198 | 47 | 370 | 493 | 347 | 58 | 102 | 423 | 458 | 278 | 125 |
| 324 | 79 | 8 | 166 | | | | | | | | | | |

Fig. 11

DEVICES AND METHODS IMPLEMENTING POLAR CODES

CROSS-REFERENCE TO RELATED APPLICATIONS

This application is a continuation of International Application No. PCT/EP2016/060730, filed on May 12, 2016, the disclosure of which is hereby incorporated by reference in its entirety.

TECHNICAL FIELD

In general, embodiments of the present invention relate to data encoding and decoding in communication systems. More specifically, embodiments of the present invention relate to devices and methods for encoding and decoding data using polar codes.

BACKGROUND

Polar codes define a new class of channel codes, which were introduced by Arikan in his seminal work "Channel polarization: a method for constructing capacity-achieving codes for symmetric binary-input memoryless channels", IEEE Trans. Inform. Theory, July 2009. Polar codes are capacity-achieving over various classes of channels under encoding and decoding complexity of order O(N log N) in the code length N which was a break-through in coding theory. These codes have remarkable performance for practical finite code lengths as well. The state-of-the-art decoder uses successive cancellation (SC) decoding, as described in the above mentioned work of Arikan, in connection with list decoding (e. g., Tal and A. Vardy in "List decoding of polar codes," in IEEE ISIT July 2011) and possibly an additional cyclic-redundancy-check (CRC) to improve the distance properties of the code and to improve the list decoding (e. g., Kai Niu and Kai Chen, "CRC-Aided Decoding of Polar Codes", IEEE Commun. Letters, vol. 16, no. 10, October 2012).

According to their initial construction, polar codes have lengths N that are powers of two, i.e. $N=2^n$, where n is an integer. However, recent works have proposed ways to puncture or shorten polar codes of length N in order to achieve any code length N' ($N \neq N'$). Therefore, any code rate R, wherein $R=K/N$, K being the number of information bits, is possible. In practical deployments, a CRC is applied to the K information bits. This CRC significantly improves the code properties, and is also exploited in the decoding process.

A (N, K) polar code, where $N=2^n$, is defined by the following matrix:

$$F_n = \begin{bmatrix} 1 & 0 \\ 1 & 1 \end{bmatrix}^{\otimes n},$$

wherein $\otimes n$ denotes the n-fold Kronecker product of the 2×2 base matrix $$\begin{bmatrix} 1 & 0 \\ 1 & 1 \end{bmatrix},$$

and a frozen set F containing the indices of the frozen bits, which are not used for information transmission. The K information bits can be encoded using polar codes of length N either by means of non-systematic encoding or by means of systematic encoding.

FIG. 1(a) shows an example of non-systematic encoding of four information bits using a polar code of length eight, referred to as a (8, 4) polar code having a rate $R=1/2$, according to the above mentioned work of Arikan. In this figure, the mutual information $I(W_i)$ of the so-called virtual channels for the bits $u_i$ is shown on the left-hand side. The mutual information $I(W_i)$ expresses the bit-channel reliability: if it is close to one, than the channel is defined as a 'good' channel and can be used to transmit information bits. On the contrary, if $I(W_i)$ is close to zero than the channel is defined as a 'bad' channel and it shouldn't be used to transmit information bits. Therefore, the four bit indices corresponding to the lowest values of the mutual information $I(W_i)$ are collected into the set of frozen bit indices $F=\{1, 2, 3, 5\}$, in order to obtain a code having a rate $R=1/2$. For encoding, the four information bits $[u_0 \; u_1 \; u_2 \; u_3]$ are placed in the non-frozen position and the bits corresponding to the indices contained in the set of frozen bit indices F are set to zero. Through matrix multiplication the code bits $[c_0 \; c_1 \; c_2 \; c_3 \; c_4 \; c_5 \; c_6 \; c_7]$ are obtained as follows:

$$[0 \; 0 \; 0 \; u_0 \; 0 \; u_1 \; u_2 \; u_3] \times \begin{bmatrix} 1 & 0 \\ 1 & 1 \end{bmatrix}^{\otimes 3} = [c_0 \; c_1 \; c_2 \; c_3 \; c_4 \; c_5 \; c_6 \; c_7].$$

FIG. 1(b) shows an example of systematic encoding of an (8, 4) polar code, wherein the systematic encoding can be achieved by a two-step scheme as illustrated in "Flexible and low-complexity encoding and decoding of systematic polar codes," in arXiv:1507.03614 July 2015, by Sarkis et. al. The first step is identical to the one in non-systematic encoding. In the vector obtained after the first step, the frozen bits are again set to zero, and the non-systematic encoding is applied again. As a result, a systematic encoder is obtained and the information bits become the systematic bits in the code word (bits on the right). The sets of indices of frozen bits define the polar codes, hence their design is of paramount importance for the code performance.

In both the non-systematic encoder and the systematic encoder, a CRC may be applied to the vector of information bits, defined by $[u_0 \; u_1 \; u_2 \; u_3]$ in the above mentioned example.

Concerning the decoding by means of polar codes, there are two main decoding algorithms: the successive cancellation (SC) decoding, as suggested in the above mentioned work by Arikan, and the list SC (LSC) decoding, as suggested in List Decoding of Polar Codes," in IEEE ISIT July 2011 by Tal and A. Vardy and in "CRC-Aided Decoding of Polar Codes", IEEE Commun. Letters, vol. 16, no. 10, October 2012 by Kai Niu and Kai Chen. The SC decoding scheme has extremely low complexity and is sufficient for very large code lengths N due to the polarization effect. For medium-length and short-length codes, the LSC decoding scheme is preferred due to the fact that it can efficiently deal with the error propagation of SC decoding. Furthermore, the LSC decoding scheme allows to decrease the decoding error rate by using longer lists. Thus it allows to trade performance versus complexity.

FIG. 2 shows the bit error rate as a function of the signal-to-noise-ration (SNR) in dB for different decoding schemes, in case of a binary phase shift keying—additive white Gaussian noise ((BPSK-AWGN) channel. In particular, it allows to compare the performance of a (2048, 1024) polar code using SC and LSC (L=32) decoding schemes to the performance of the state-of-the-art channel decoding schemes. This comparison shows that polar codes are a very powerful class of channel codes, and they can be expected to play an important role in future communication systems.

The original polar code construction allows for any code rate, by choosing the size of the frozen set. However, they allow only the construction of codes having lengths that are powers of 2, i.e., $N=2^n$. The restriction of the length of the code is a major drawback of polar codes, which needs to be overcome for practical applications. Using the techniques of so-called puncturing and shortening from coding theory, the polar codes can be trimmed to any code length, as it will be explained in the following. In the following, polar codes of lengths $N=2^n$ will also be referred to as mother polar codes.

FIG. 3(a) illustrates the main idea of puncturing. In puncturing, one or more code bits are not transmitted. The decoder typically handles punctured bits as erased and applies the decoder of the mother polar code of length N. Puncturing has the benefit of making the code rate R more flexible and allows immediately for incremental redundancy, however it gives less control on the resulting distance properties. If a code of length N' has to be created to encode K information bits with R=K/N', then a mother (K, N) polar code is used to encode the data, with N>N', and P=N−N' bits are punctured. For decoding, the P punctured code bits are assigned log-likelihood ratios (LLR) of zero, and usual decoding of the mother polar code of length N is applied. Puncturing changes the code properties and the decoding behavior, therefore the positions to be punctured need to be carefully chosen.

FIG. 3(b) illustrates the main idea of shortening. In shortening, a sub-code of the mother polar code of length N is used in which one or more bits are restricted to a fixed value, typically zero. In the case of a systematic encoder, one or more systematic bits can be chosen for this purpose, and they can simply be set to zero in the encoding process. These fixed bits are not transmitted. At the decoder side, the shortened bits are known, their LLRs are set to very large values, and the decoder of the mother polar code of length N is applied. Shortening achieves the same code rate flexibility as puncturing, however with more control over the code properties. If a code of length N' has to be created to encode K information bits, the data is initially padded with S=N−N' zeros (also called the shortening bits), and a (N, K+S) mother polar code is chosen with N>N'. The obtained K+S information bits and shortening bits are encoded using a systematic polar encoder. Before transmission the S shortening bits are removed. This procedure preserves the minimum distance of the mother polar code and thus provides more control over the code properties than puncturing. At the decoder side, the S removed bits are known to be zero. Correspondingly the LLRs of these code bits are initialized with large positive values (in theory with infinity). Afterwards, usual decoding of the mother polar code of length N is applied.

In both puncturing and shortening, the selection of the bit positions to puncture or shorten is of paramount importance in the mother polar code design in order to obtain good error-rate performance.

In the conventional art several solutions are provided in order to design sets of frozen bit indices, sets of puncturing bit indices and sets of shortening bit indices. These solutions can be divided into three categories: optimal puncturing/shortening pattern generation, optimal frozen set generation and joint optimization, as will be described in the following.

The optimal puncturing or shortening pattern generation technique deals with finding the optimal puncturing or shortening patterns once the frozen sets of the mother polar code are given. This technique is used in the work "On the Puncturing Patterns for Punctured Polar Codes", IEEE ISIT July 2014, by Zhang et. al, to create a punctured polar code. In particular, the less reliable bits are selected to be frozen, and an algorithm is run to find an optimal puncturing pattern leading to the selected frozen bits. The error-rate performance of this technique is sub-optimal compared to other ones, but the puncturing pattern is less complex to compute. Still, the optimization algorithm has to be run every time a (N, K) polar code has to be generated. This increases the latency of the system, which is a disadvantage of this approach.

The optimal frozen set generation technique deals with finding the optimal frozen set once the puncturing or shortening pattern is given. This technique is proposed for shortening of non-systematic polar codes in the work "A Novel Puncturing Scheme for Polar Codes", IEEE Commun. Letters, December 2014, by Wang et. al, while it is proposed for puncturing of non-systematic polar codes in the works "Design of Length-Compatible Polar Codes Based on the Reduction of Polarizing Matrices", IEEE Trans. Commun., 2013, by Shin et. al. and "Beyond Turbo Codes: Rate-Compatible Punctured Polar Codes", IEEE ICC June 2013 by C. Kai et al. In the above mentioned work by Wang et al., the shortening pattern is selected using the last bits of a (N, K) mother polar code. Similarly, in the above mentioned works by Shin et al. and by Kai et al., the puncturing pattern is generated according to a certain heuristic, and a density evolution (DE) algorithm is run to find the optimal frozen set given the puncturing pattern. The frozen set needs to be calculated at every encoding and every decoding, whenever the code is changed, and the DE algorithm is a relatively complex algorithm. Even though the error-rate performance of this technique is good, the high complexity and resulting latency due to the DE calculation makes this technique unattractive for practical implementations.

The joint optimization technique is presented for shortening of non-systematic polar codes in the work "Shortened Polar Codes", IEEE Trans. Inform. Theo., September 2015 by V. Miloslavskaya. In this technique, the frozen set and the shortening pattern are jointly optimized. For a given (N', K) code, a search over all possible shortening patterns is performed. The complexity of this full search can largely be reduced by exploiting certain symmetries of the polar encoder. The error-rate performance of this technique is good due to the optimal design. However, large amounts of memory are required for storing a table comprising the frozen set and the shortening pattern for every N' and K. For practical applications that require large sets of code lengths N' and code rates R, this method is not convenient.

Although the above mentioned techniques of the conventional art provide some solutions to the problem of designing codes having arbitrary lengths and rates by using polar codes, they all present disadvantages related to their practical implementations due to their high description complexity. One of the main disadvantages of existing techniques is the lack of structure in the generation of the frozen sets, the puncturing patterns and the shortening patterns. In particular, every (N', K) code has a different frozen set and puncturing or shortening pattern, and for each pair (N', K), these sets and patterns have to either be stored, requiring a large memory for storage, or be calculated on the fly, resulting in large computational complexity.

Therefore, there is a need for improved devices and methods implementing polar codes in communication systems.

SUMMARY

It is an object of the invention to provide improved devices and methods implementing polar codes in communication systems.

The foregoing and other objects are achieved by the subject matter of the independent claims. Further implementation forms are apparent from the dependent claims, the description and the figures.

According to a first aspect, the invention relates to an encoder for encoding K information bits into a code word of length N' on the basis of a polar code of length N, wherein N is a power of 2 and greater than or equal to N'. The encoder comprises a memory storing a plurality of bit indices, wherein the plurality of bit indices comprise a set of N frozen bit indices associated with the polar code of length N, a set of N/2 puncturing bit indices and/or a set of N/2 shortening bit indices. Furthermore the encoder comprises a processor configured to retrieve at least a subset of the plurality of bit indices from the memory, to encode the K information bits using the polar code of length N for obtaining encoded data of length N and to reduce the number of bits of the encoded data to the length N' for obtaining the code word of length N'.

Thus, a compact and simple description of polar codes is provided to generate the frozen set. Furthermore, the set of frozen bit indices required to describe the polar codes can be optimized off-line, such that high complexity algorithms can be applied in this code optimization. This represents another advantage compared to the methods used in conventional art, wherein the code parameters are determined online and low-complexity methods have to be used due to computational and latency constraints in the transmitter and in the receiver. Furthermore, the low description complexity allows for practical application in systems, where a large set of polar codes with various different lengths and rates is required.

In a first possible implementation form of the encoder according to the first aspect as such, the plurality of bit indices further comprise a set of M frozen bit indices associated with a polar code of length M, a set of M/2 puncturing bit indices and/or a set of M/2 shortening bit indices, wherein M is a power of 2 and smaller than N, and wherein the processor is configured to encode the K information bits using the polar code of length M and to reduce the number of bits of the encoded data to the length N', in case N' is smaller than or equal to M.

In a second possible implementation form of the encoder according to the first aspect as such or the first implementation form thereof, the plurality of bit indices are stored in a look-up table of the memory.

In a third possible implementation form of the encoder according to the first or second implementation form thereof, the processor is configured to reduce the number of bits of the encoded data to the length N' by puncturing the encoded data of length N.

In a fourth possible implementation form of the encoder according to the third implementation form thereof, the plurality of bit indices comprise the set of N frozen bit indices and the retrieved subset of the plurality of bit indices comprise the first N−K frozen bit indices of the set of N frozen bit indices.

In a fifth possible implementation form of the encoder according to the fourth implementation form thereof, the plurality of bit indices further comprise the set of N/2 puncturing bit indices and the retrieved subset of the plurality of bit indices further comprise the first P puncturing bit indices of the set of N/2 puncturing bit indices, wherein P=N−N'. Furthermore, the processor is configured to reduce the number of bits of the encoded data to the length N' by puncturing the bits of the encoded data of length N identified by the first P puncturing bit indices of the set of N/2 puncturing bit indices.

In a sixth possible implementation form of the encoder according to any one of the first to fifth implementation form thereof, the processor is configured to reduce the length of the encoded data to the length N' by shortening the encoded data of length N.

In a seventh possible implementation form of the encoder according to the sixth implementation form thereof, the plurality of bit indices comprise the set of N frozen bit indices and the retrieved subset of the plurality of bit indices comprise the first N−K−S frozen bit indices of the set of N frozen bit indices, wherein S=N−N'.

In an eight possible implementation form of the encoder according to the seventh implementation form thereof, the plurality of bit indices further comprise the set of N/2 shortening bit indices and the retrieved subset of the plurality of bit indices further comprise the first S shortening bit indices of the set of N/2 shortening bit indices. Furthermore, the processor is configured to reduce the length of the encoded data to the length N' by shortening the bits of the encoded data of length N identified by the first S shortening bit indices of the set of N/2 shortening bit indices.

In a ninth possible implementation form of the encoder according to any one of the first to eighth implementation form thereof, the plurality of bit indices comprise a first set of N frozen bit indices related to the set of N/2 puncturing bit indices and a second set of N frozen bit indices related to the set of N/2 shortening bit indices.

According to a second aspect, the invention relates to a method for encoding K information bits into a code word of length N' on the basis of a polar code of length N, wherein N is a power of 2 and greater than or equal to N'. The method comprises the steps of storing a plurality of bit indices in a memory, wherein the plurality of bit indices comprise a set of N frozen bit indices associated with the polar code of length N, a set of N/2 puncturing bit indices and/or a set of N/2 shortening bit indices, retrieving at least a subset of the plurality of bit indices from the memory, encoding the K information bits using the polar code of length N for obtaining encoded data of length N and reducing the number of bits of the encoded data to the length N' for obtaining the code word of length N'.

According to a third aspect, the invention relates to a decoder for decoding K information bits encoded in a code word of length N' on the basis of a polar code of length N, wherein N is a power of 2 and greater than or equal to N'. The decoder comprises a memory storing a plurality of bit indices, wherein the plurality of bit indices comprise a set of N frozen bit indices associated with the polar code of length N, a set of N/2 puncturing bit indices and/or a set of N/2 shortening bit indices and a processor configured to retrieve at least a subset of the plurality of bit indices from the memory and to decode the K information bits encoded in the code word of length N' using the polar code of length N for obtaining decoded data of dimension K.

In a first possible implementation form of the decoder according to the third aspect as such, the plurality of bit indices further comprise a set of M frozen bit indices associated with a polar code of length M, a set of M/2 puncturing bit indices and/or a set of M/2 shortening bit indices, wherein M is a power of 2 and smaller than N, and wherein the processor is configured to decode the K information bits encoded in the code word of length N' using the polar code of length M, in case N' is smaller than or equal to M.

In a second possible implementation form of the decoder according to the third aspect as such, the plurality of bit indices are stored in a look-up table of the memory.

According to a fourth aspect, the invention relates to a method for decoding K information bits encoded in a code word of length N' on the basis of a polar code of length N, wherein N is a power of 2 and greater than or equal to N'. The method comprises the steps of storing a plurality of bit indices in a memory, wherein the plurality of bit indices comprise a set of N frozen bit indices associated with the polar code of length N, a set of N/2 puncturing bit indices and/or a set of N/2 shortening bit indices, retrieving at least a subset of the plurality of bit indices from the memory and decoding the K information bits encoded in the code word of length N' using the polar code of length N for obtaining decoded data of dimension K.

BRIEF DESCRIPTION OF THE DRAWINGS

Further embodiments of the invention will be described with respect to the following figures, wherein:

FIG. 9 shows a look-up table comprising a set of frozen bit indices according to an embodiment;

FIG. 10 shows a look-up table comprising a set of puncturing bit indices according to an embodiment;

FIG. 11 shows a look-up table comprising a set of shortening bit indices according to an embodiment;

In the various figures, identical reference signs will be used for identical or at least functionally equivalent features.

DETAILED DESCRIPTION OF EMBODIMENTS

In the following description, reference is made to the accompanying drawings, which form part of the disclosure, and in which are shown, by way of illustration, specific aspects in which the present invention may be placed. It will be appreciated that other aspects may be utilized and structural or logical changes may be made without departing from the scope of the present invention. The following detailed description, therefore, is not to be taken in a limiting sense, as the scope of the present invention is defined by the appended claims.

For instance, it will be appreciated that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures.

Moreover, in the following detailed description as well as in the claims embodiments with different functional blocks or processing units are described, which are connected with each other or exchange signals. It will be appreciated that the present invention covers embodiments as well, which include additional functional blocks or processing units that are arranged between the functional blocks or processing units of the embodiments described below.

Finally, it is understood that the features of the various exemplary aspects described herein may be combined with each other, unless specifically noted otherwise.

Figure 1:
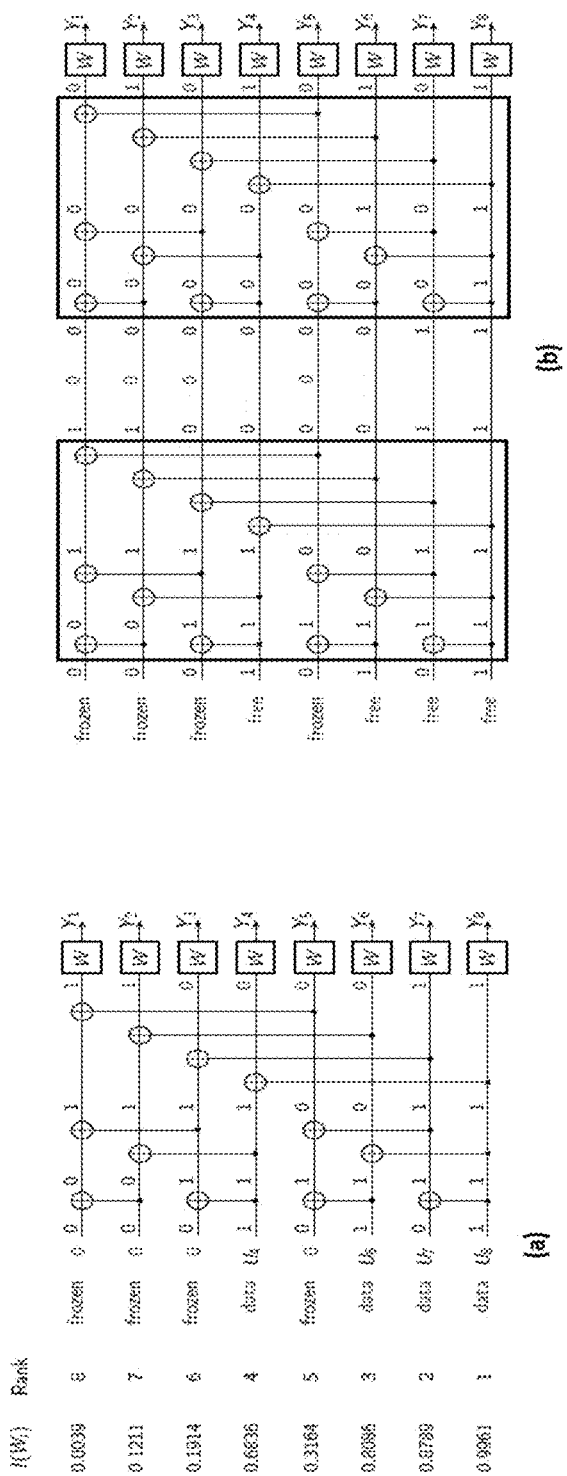
FIG. 1 shows an example of non-systematic encoding of a polar code (a) and an example of a systematic encoding of a polar code (b)
Figure 2:
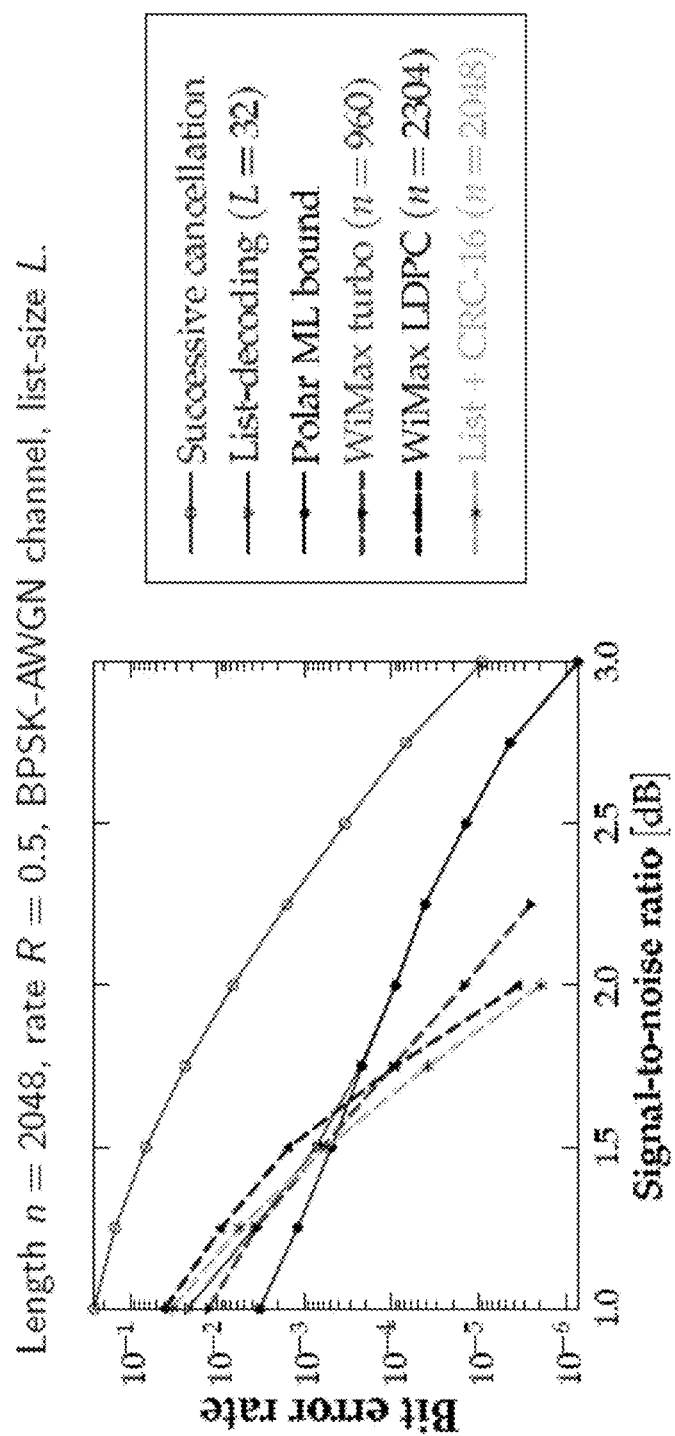
FIG. 2 shows the bit error rate as a function of the signal-to-noise-ratio in dB for different decoding schemes.
Figure 3:
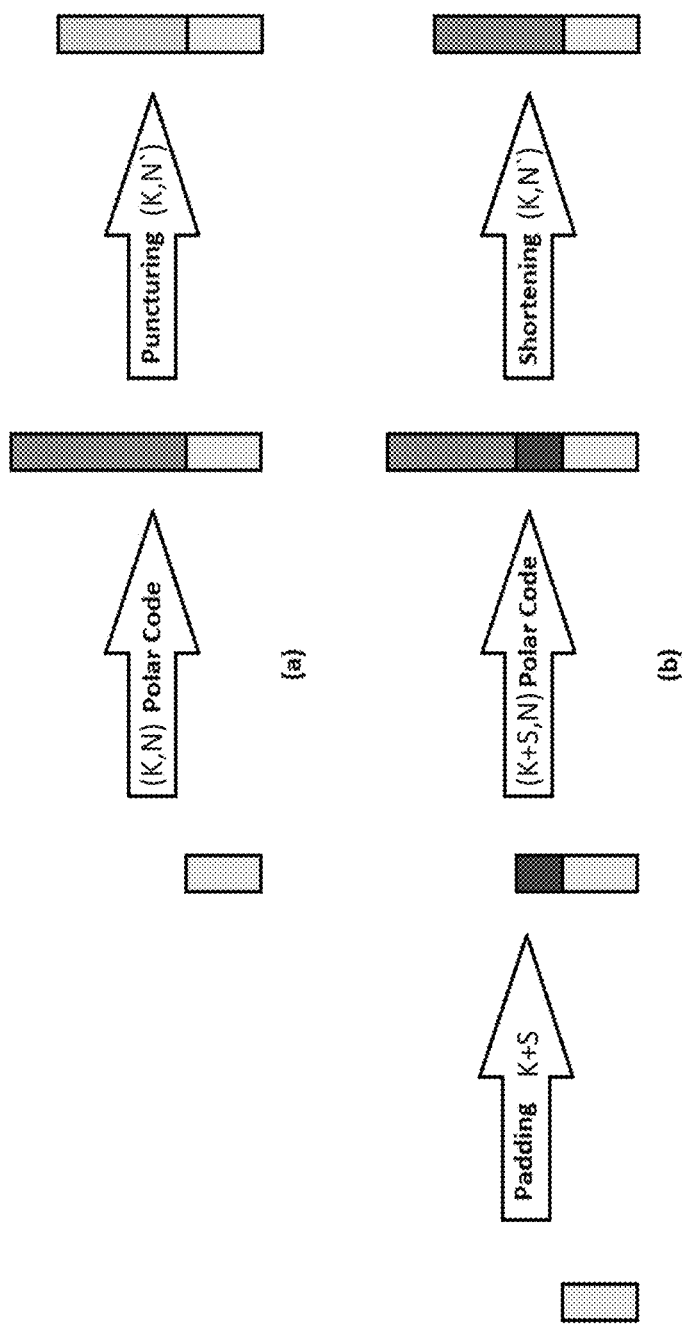
FIG. 3 shows a schematic diagram illustrating the main idea of puncturing (a) and of shortening (b)
Figure 4:
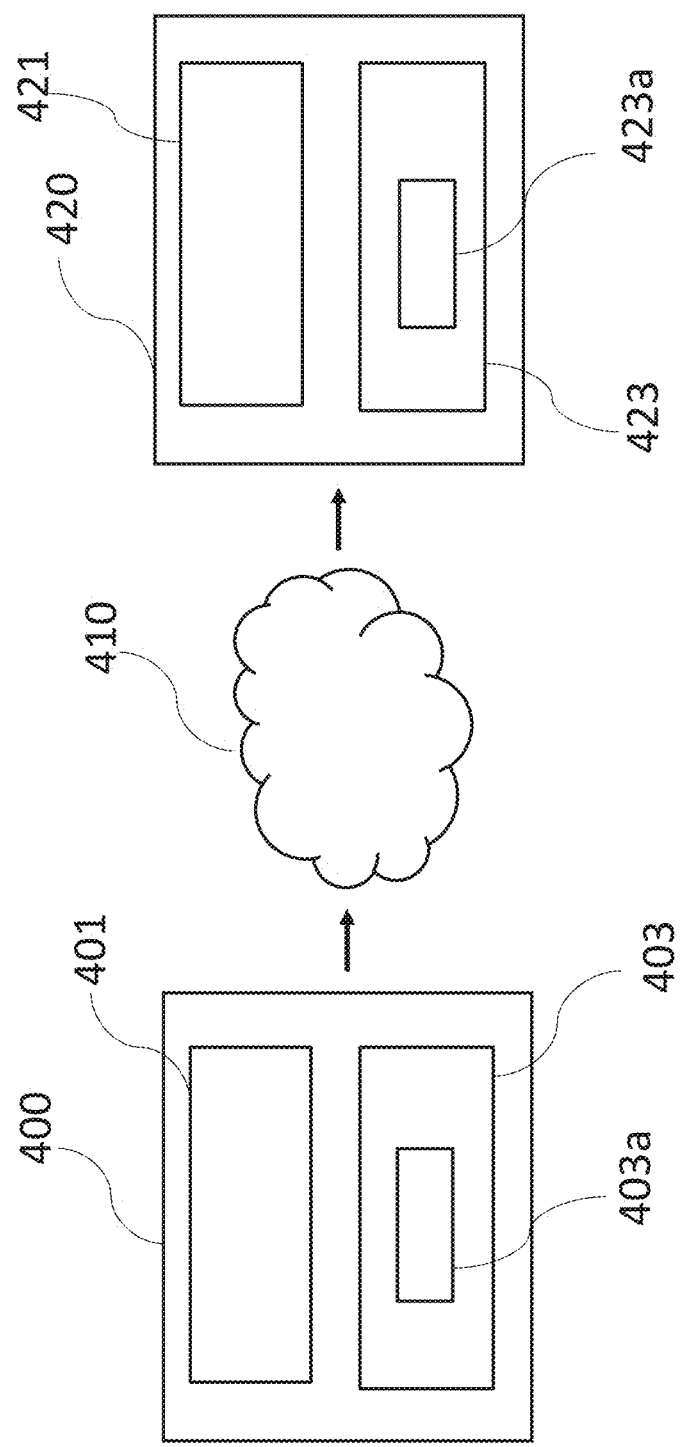
FIG. 4 shows a schematic diagram of a communication system comprising an encoder according to an embodiment and a decoder according to an embodiment.

FIG. 4 shows a schematic diagram of an encoder 400 and of a decoder 420, which are configured to communicate over a communication channel 410 using a polar code according to an embodiment. In the embodiment shown in FIG. 4, the encoder 400 comprises a processor 401, a memory 403 and a look-up table 403a which is stored in the memory 403. In the embodiment shown in FIG. 4, the decoder 420 comprises a processor 421, a memory 423 and a look-up table 423a which is stored in the memory 423.

As will be described in further detail below, according to embodiments of the invention, a shorter code of length N' of K information bits and rate R=K/N' can be obtained from the mother polar code of length $N=2^n$, wherein $n=\text{ceil}(\log_2(N'))$, by puncturing, shortening, combined puncturing and shortening or may be determined based on the desired code parameters N' and R, e.g. by a simple function.

Thus in an embodiment, the encoder 400 is configured to encode K information bits into a code word of length N' on the basis of a polar code of length N, wherein N is a power of 2 and greater than or equal to N'. The memory 403 stores a plurality of bit indices, wherein the plurality of bit indices comprise a set of N frozen bit indices associated with the polar code of length N, a set of N/2 puncturing bit indices and/or a set of N/2 shortening bit indices. The processor 401 is configured to retrieve at least a subset of the plurality of bit indices from the memory 403, to encode the K information bits using the polar code of length N for obtaining encoded data of length N and to reduce the number of bits of the encoded data to the length N' for obtaining the code word of length N'.

In an embodiment, the above mentioned techniques for encoding and decoding can require the use of look-up tables 403a and 423a, wherein the look-up tables 403a and 423a comprise sets of bit indices, according to the following rules. In the case of puncturing, a set of N frozen bit indices and a set of N/2 puncturing bit indices can be used. In the case of shortening, a set of N frozen bit indices and a set of N/2 shortening bit indices can be used. In the case of combined puncturing and shortening, a set of N frozen bit indices, a set of N/2 puncturing bit indices and a set of N/2 shortening bit indices can be used.

In an embodiment, the shorter code of length N' can be constructed by puncturing a mother polar code of length N according to the following rules: the frozen set comprises the first F=N−K indices of the set of frozen bit indices and the puncturing set comprises the first P=N−N' indices of the set of puncturing bit indices.

In an embodiment, the shorter code of length N' can be constructed by shortening a mother polar code of length N according to the following rules: the frozen set comprises the first F=N−K−S indices of the set of frozen bit indices and the shortening set comprises the first S=N−N' indices of the set of shortening bit indices. The bits which are used for shortening are set to zero.

In an embodiment, the set of N/2 puncturing bit indices and the set of N/2 shortening bit indices can be derived from the set of N frozen bit indices, wherein the set of N/2 puncturing bit indices corresponds to the first N/2 indices of the set of N frozen bit indices in bit-reversal order and the set of N/2 shortening bit indices corresponds to the inversion of the last N/2 indices of the set of N frozen bit indices in bit-reversal order.

In an embodiment, the shorter code of length N' can be constructed by a combination of puncturing and shortening of a mother polar code of length N according to the following rules: the frozen set comprises the first F indices of the set of frozen bit indices, the puncturing set comprises the first P indices of the puncturing bit indices and the shortening set comprises the first S indices of the shortening bit indices. The bits which are used for shortening are set to zero, while the values of F, P and S are chosen as a function of N' and R in a pre-determined way, e.g. in such a way that the error-rate is minimized.

In an embodiment, the encoder 400 is a systematic encoder 400 and the decoder 420 is a systematic decoder 420. Furthermore, the proposed techniques for generating a code of length N' using a mother polar code of length N can be implemented using the systematic encoding scheme mentioned in the background section.

In an embodiment, the look-up tables 403a and 423a storing the sets of frozen bit indices, the sets of puncturing bits indices and the sets of shortening bit indices can be determined off-line. A possible way to compute the look-up tables 403a and 423a is detailed in the descriptions of FIG. 9, FIG. 10 and FIG. 11.

This invention proposes a solution for encoding and decoding information bits which requires only small storage memory 403 and allows to define the codes, as required by the encoder 400 and the decoder 420, by simple and fast look-up tables 403a and 423a. Furthermore, the look-up tables 403a and 423a can be generated off-line. Therefore, high complexity is affordable for the optimization of the look-up tables 403a and 423a without impacting the encoder 400 and decoder 420 in the actual application.

Figure 5:
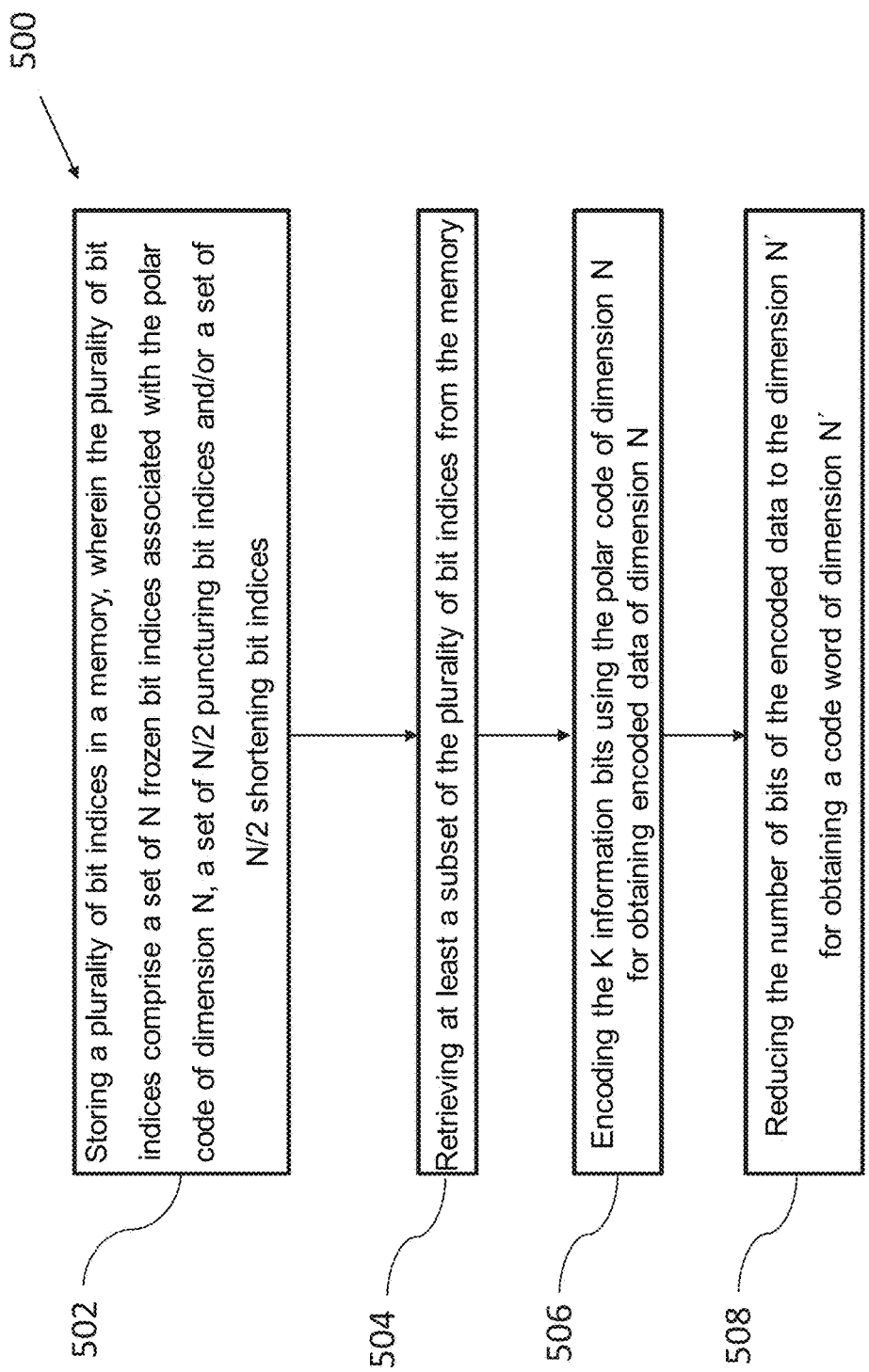
FIG. 5 shows a schematic diagram of a method for encoding data using a polar code according to an embodiment.

FIG. 5 shows a schematic diagram of a method 500 for encoding data using a polar code according to an embodiment. In this embodiment, the method 500 for encoding K information bits into a code word of length N' on the basis of a polar code of length N, wherein N is a power of 2 and greater than or equal to N', comprises the steps of storing 502 a plurality of bit indices in a memory 403, wherein the plurality of bit indices comprise a set of N frozen bit indices associated with the polar code of length N, a set of N/2 puncturing bit indices and/or a set of N/2 shortening bit indices, retrieving 504 at least a subset of the plurality of bit indices from the memory 403, encoding 506 the K information bits using the polar code of length N for obtaining encoded data of length N and reducing 508 the number of bits of the encoded data to the length N' for obtaining the code word of length N'.

Figure 6:
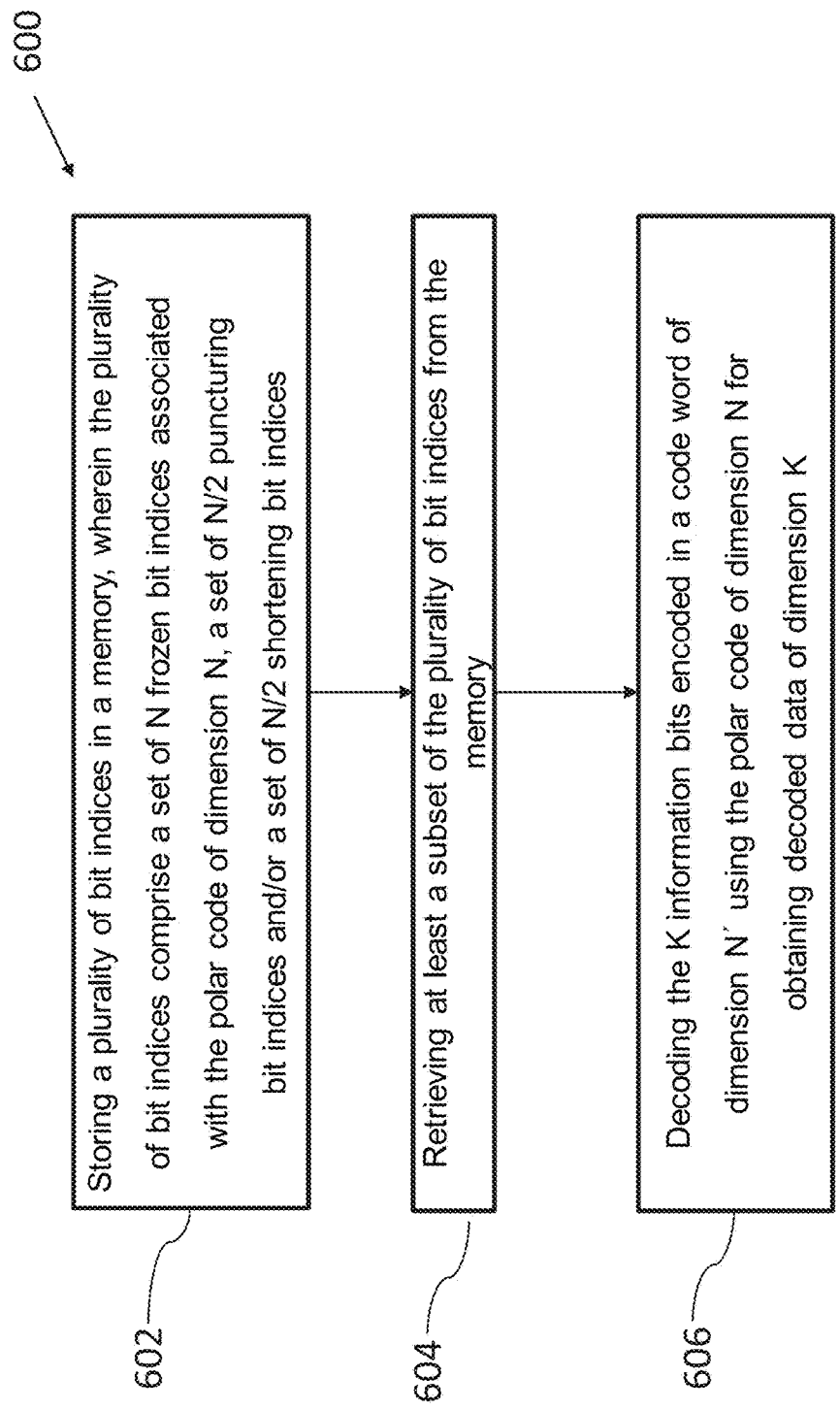
FIG. 6 shows a schematic diagram of a method for decoding data using a polar code according to an embodiment.

FIG. 6 shows a schematic diagram of a method 600 for decoding data using a polar code according to an embodiment. In this embodiment, the method 600 for decoding K information bits encoded in a code word of length N' on the basis of a polar code of length N, wherein N is a power of 2 and greater than or equal to N', comprises the steps of storing 602 a plurality of bit indices in a memory 423, wherein the plurality of bit indices comprise a set of N frozen bit indices associated with the polar code of length N, a set of N/2 puncturing bit indices and/or a set of N/2 shortening bit indices, retrieving 604 at least a subset of the plurality of bit indices from the memory 423 and decoding 606 the K information bits encoded in the code word of length N' using the polar code of length N for obtaining decoded data of dimension K.

Figure 7:
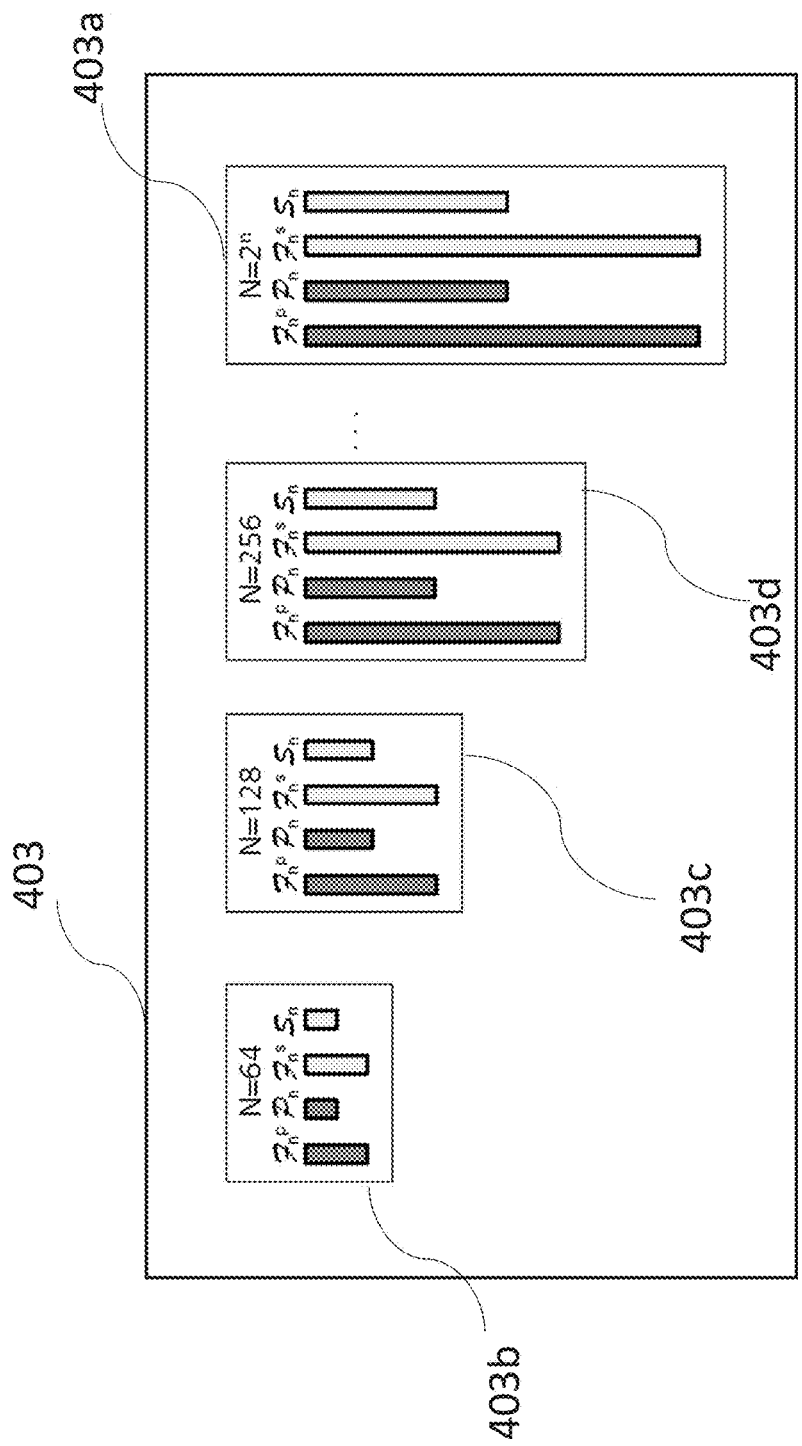
FIG. 7 shows a schematic diagram of look-up tables for polar codes according to an embodiment.

FIG. 7 shows a schematic diagram of several look-up tables 403a, 403b, 403c and 403d stored in a memory 403. In this embodiment, it is assumed that for each length of a mother polar code N, from N=64 to N=$2^n$, n being a natural number, the look-up tables 403a, 403b, 403c and 403d comprising frozen bit indices ($F_n^p$ and $F_n^s$), puncturing bit indices ($P_n$) and shortening indices ($S_n$) are provided. In this embodiment, the dimension of $F_n^p$ and $F_n^s$ is N and the dimension of both $P_n$ and $S_n$ is N/2. Therefore, for every value of n required by the system, i.e. for every n such that $\log_2(N'_{min}) < n < \log_2(N'_{max})$, one of the look-up tables 403a, 403b, 403c and 403d can be stored in the memory 403. The stored look-up table, e.g. 403a, comprises two sets of indices for puncturing ($F_n^p$ and $P_n$) and two sets of indices for shortening ($F_n^s$ and $S_n$). In particular, for puncturing, a set of $F_n^p$ frozen bit indices of size 2n, comprising indices from 1 to $2^n$, and a set of $P_n$ puncturing bit indices of size $2^{n-1}$, comprising indices from 1 to $2^n$, can be stored in the memory 403. For shortening, a set of $F_n^s$ frozen bit indices of size 2n, comprising indices from 1 to $2^n$, and a set of $S_n$ shortening bit indices of size $2^{n-1}$, comprising indices from 1 to $2^n$, can be stored in the memory 403. Therefore, for every value of n, four sets of bit indices can be stored in the memory 403, resulting in $3 \times 2^n$ bits being stored in the memory 403. Generalizations including combined sets of indices for shortening and puncturing follow along the same lines.

Figure 8:
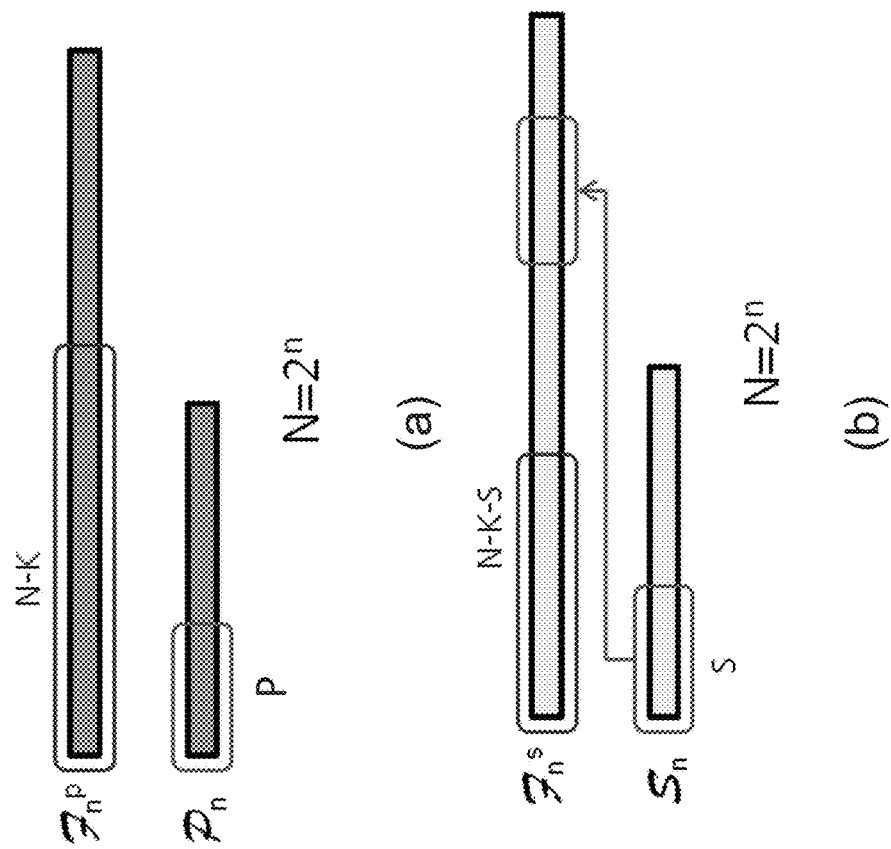
FIG. 8 shows schematic diagrams of a puncturing scheme (a) and of a shortening scheme (b) for polar codes according to an embodiment.

FIG. 8 shows a schematic diagram of a puncturing scheme (a) and of a shortening scheme (b) for polar codes according to an embodiment. In order to generate a (N', K) punctured polar code with $N' \neq 2^n$, the length of the mother polar code $N=2^n$ can be calculated, wherein $n=\text{ceil}(\log_2(N'))$ and K is the dimension of the information set. In an embodiment, the set of $F_n^p$ frozen bit indices and the set of $P_n$ puncturing bit indices can be read in the memory 403. In this embodiment, the first N−K indices of $F_n^p$ represent the elements of the frozen set, while the remaining K indices correspond to the bit indices of the information set. The K information bits can be encoded using a systematic polar encoder 400 using the (N, K) mother polar code. After the encoding, the bits can be punctured to reduce the length of the code word. The first P=N−N' entries of $P_n$ are selected as the positions of the bits to be punctured, as schematically shown in (a). Then, the bits in the punctured position are discarded. After the puncturing, the remaining N' bits are transmitted. At the receiver, the log-likelihood ratios (LLR) of the received code bits are calculated. Afterwards, a decoder 420 for the (N, K) mother polar code is run, where the LLR values of the bits in the punctured positions can be set to zero.

In (b), a shortening scheme is shown according to an embodiment in order to generate a (N', K) shortened polar code with $N' \ne 2^n$, the length of the mother polar code being $N=2^n$, wherein $n=\text{ceil}(\log_2(N'))$. The set of $F_n$ frozen bit indices and the set of $S_n$ shortening bit indices can be read in the memory 403. The first N−K−S indices of $F_n^s$ correspond to the elements of the set comprising the frozen bit indices, where S=N−N'. The remaining K+S indices represent the indices of the information bits of the (N, K+S) mother polar code. The first S indices of $S_n$ represent a subset of the information set, and can be padded with zeros, while the K information bits can be put in the remaining K indices of the set of the K+S information bits. The K+S information bits obtained in the previous stage can be encoded using a systematic polar encoder 400 using the (N, K+S) mother polar code. After the encoding, the encoded bits can be shortened in order to reduce the length of the message. The first S=N−N' entries of $S_n$ can be selected as the positions of the bits to be shortened. Afterwards, the bits in the shortened position can be discarded. After the shortening, the remaining N' code bits are transmitted. At the receiver, the LLRs of the received code bits are calculated. A decoder 420 for the (N, K+S) mother polar code is run, where the LLR values of the bits in the shortened positions can be set to very high values, indicating that these bits are perfectly known.

FIG. 9 shows a set of frozen bit indices according to an embodiment. In this embodiment, the set $F_9$ of frozen bit indices of a mother polar code of length N=512 (n=9) is generated running a density evolution (DE) algorithm with Gaussian approximation over an AWGN channel 410 at 1 dB of SNR.

FIG. 10 shows a set of puncturing bit indices according to an embodiment. In this embodiment, the set $P_9$ of frozen bit indices refers to a mother polar code of length N=512 (n=9). The set $P_9$ of puncturing bit indices is generated using the first 256 entries of $F_9$, shown in FIG. 9, in bit-reversal order.

FIG. 11 shows a set of shortening bit indices according to an embodiment. In this embodiment, the set $S_9$ of shortening bit indices refers to a mother polar code of length N=512 (n=9). The set $S_9$ of shortening bit indices is generated using the inversion of the last 256 entries of $F_9$, shown in FIG. 9, in bit-reversal order.

Figure 12:
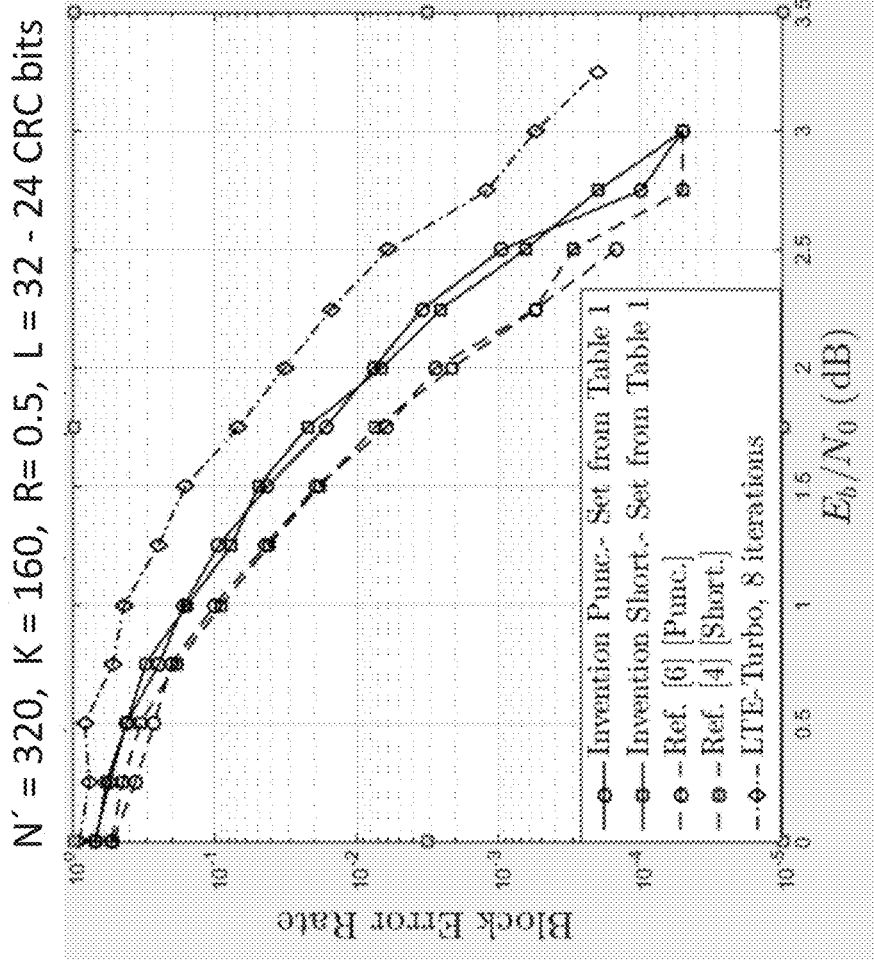
FIG. 12 shows the performance of a code using a polar code according to an embodiment.

FIG. 12 shows the performance of a code using a polar code according to an embodiment. In particular, it shows the block-error-rate of different decoding schemes as a function of the signal-to-noise-ratio ($E_b/N_0$) in dB. In this embodiment, the code has a length N'=320 and a rate R=0.5, while the mother polar code has a length $N=512=2^9$, i.e. n=9. Furthermore, the polar code uses a CRC of length 24 bits, and it is decoded using a list successive-cancellation (LSC) decoder 420 with list length L=32. The solid lines refer to the performances of the decoding schemes according to this invention using the set of frozen bit indices shown in FIG. 9, the set of puncturing bit indices shown in FIG. 10 and the set of shortening bit indices shown in FIG. 11. In this embodiment, the sets of frozen bit indices are generated using the same method for both shortening and puncturing, therefore there is a unique set of frozen bit indices, namely $F_9^p=F_9^s=F_9$. In this embodiment, the look-up table 423a comprise the set of frozen bit indices $F_9$, the set of punctured bit indices $P_9$ and the set of shortened bit indices $S_9$.

The dashed lines refer to results making use of the decoding schemes of the state-of-the-art LTE-Turbo solution (LTE-Turbo case) and to the results making use of the decoding schemes shown in the aforementioned work by Wang et al. (case [4]) and by Kai et al. (case [6]).

Figure 13:
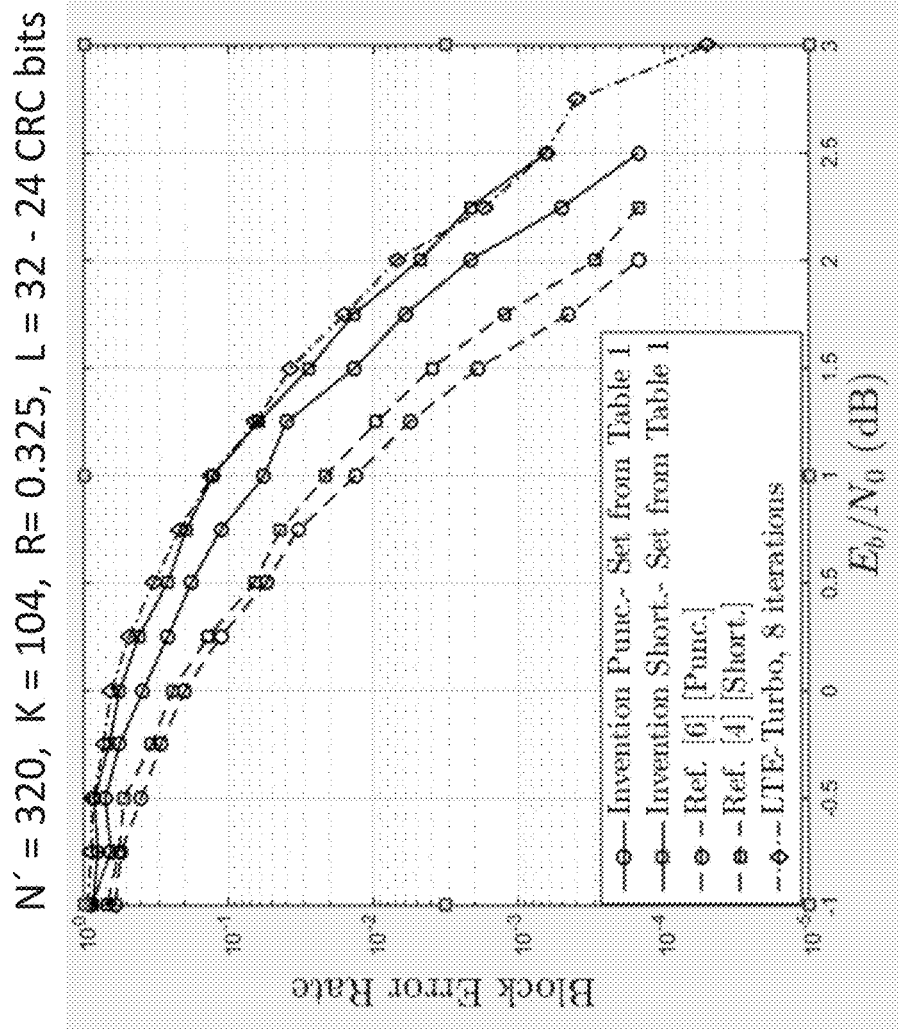
FIG. 13 shows the performance of a code using a polar code according to an embodiment.

FIG. 13 shows the performance of a code using a polar code according to an embodiment.

This case is identical to the one described in FIG. 12, with the exception that, in this case, the dimension of the information bits is K=104, therefore the code has a rate R=0.325.

Figure 14:
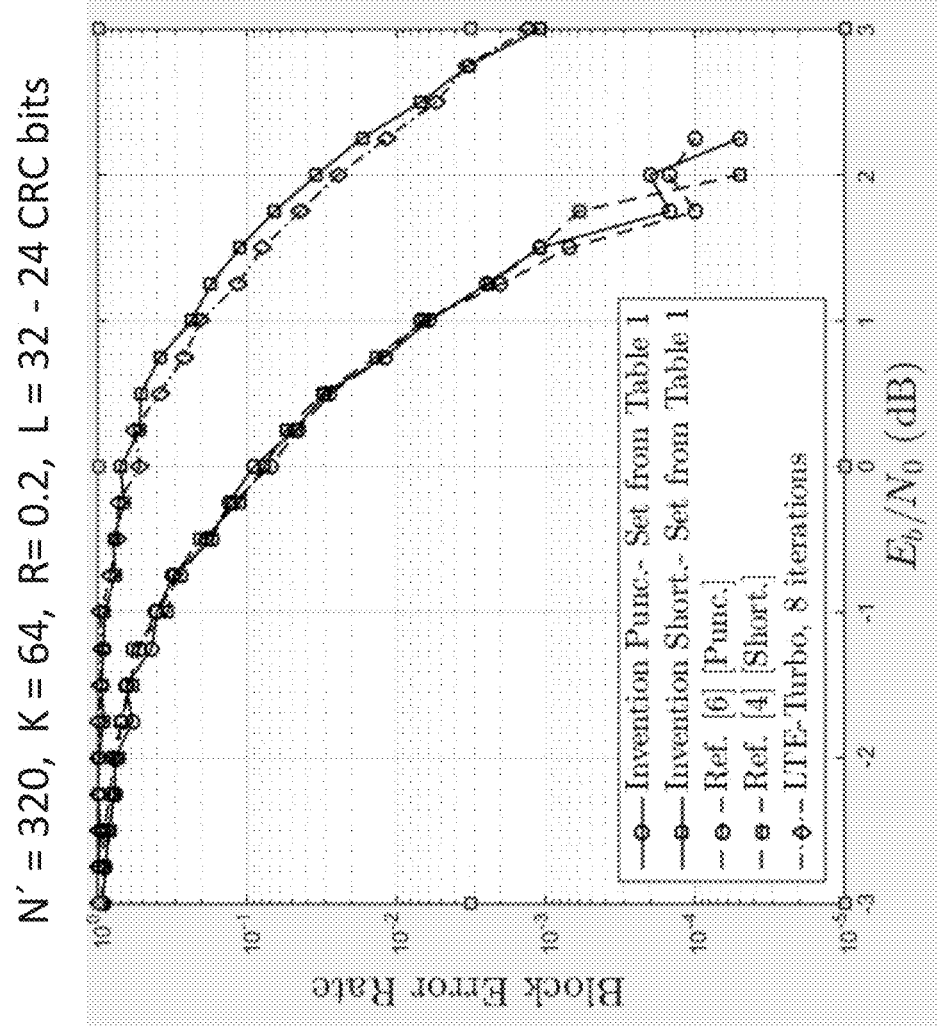
FIG. 14 shows the performance of a code using a polar code according to an embodiment.

FIG. 14 shows the performance of a code using a polar code according to an embodiment.

This case is identical to the one described in FIG. 12, with the exception that, in this case, the dimension of the information bits is K=64, therefore the code has a rate R=0.2.

Figure 15:
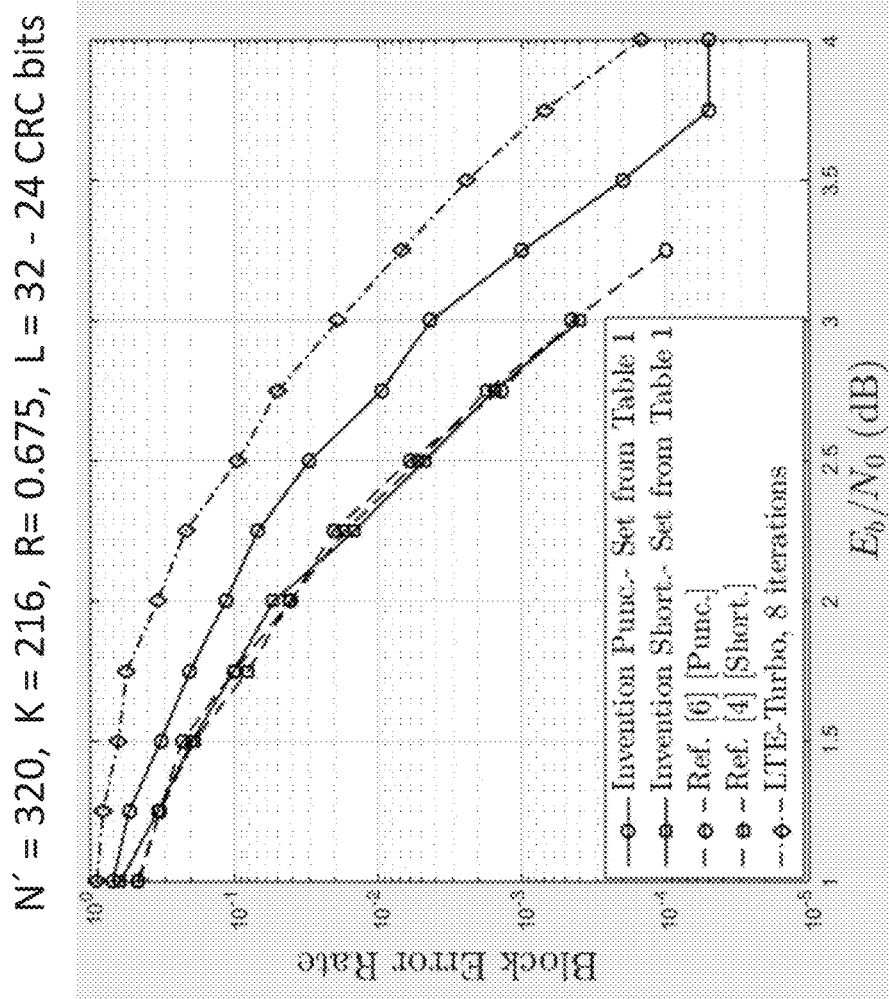
FIG. 15 shows the performance of a code using a polar code according to an embodiment.

FIG. 15 shows the performance of a code using a polar code according to an embodiment.

This case is identical to the one described in FIG. 12, with the exception that, in this case, the dimension of the information bits is K=216, therefore the code has a rate R=0.675.

The results shown in FIGS. 12 to 15 highlight the following facts. In most cases, the punctured and shortened polar codes generated from the set of indices shown in FIG. 9, FIG. 10 and FIG. 11 outperform the state-of-the-art LTE-Turbo codes of the same rate. Moreover, the performance loss of the polar codes generated from the set of indices shown in FIG. 9, FIG. 10 and FIG. 11 is generally negligible compared to the highly optimized and complex methods described in previous state-of-the-art solutions, e.g. in the aforementioned work by Wang et al. (case [4] in the plots) and in the aforementioned work by Kai et al. (case [6] in the plots). They can even have the same performance in particular cases, e.g. for R=0.2 and R=0.675. Therefore, the error-rate performance of polar codes defined in this invention remains comparable to existing solutions, where the individual codes are optimized for the desired length and rate. Furthermore, the punctured polar codes outperform the shortened polar codes for low rates, while the contrary happens for high rates. The same behavior was also observed in the aforementioned works of Wang et al. and by Kai et al. These facts give the possibility to choose the best scheme between puncturing and shortening at the encoder 400 depending on the target code rate R=K/N'. In particular only the best look-up tables 403a and 423a can be stored for a given regime, providing further gains in terms of memory consumption for storing generating tables in the memories 403 and 423.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. An encoder for encoding K information bits into a code word of length N' on the basis of a polar code of length N, wherein N is a power of 2 and greater than or equal to N', the encoder comprising:
    a memory storing a plurality of bit indices, wherein the plurality of bit indices comprise (a) a set of N frozen bit indices associated with the polar code of length N, (b) a set of N/2 puncturing bit indices, and/or (c) a set of N/2 shortening bit indices;
    a processor configured to retrieve at least a subset of the plurality of bit indices from the memory, to encode the K information bits using the polar code of length N for obtaining encoded data of length N and to reduce the number of bits of the encoded data to the length N' for obtaining the code word of length N'.

2. The encoder according to claim 1, wherein the plurality of bit indices further comprise (a) a set of M frozen bit indices associated with a polar code of length M, (b) a set of M/2 puncturing bit indices, and/or (c) a set of M/2 shortening bit indices, wherein M is a power of 2 and smaller than N, and
    wherein the processor is configured to encode the K information bits using the polar code of length M and to reduce the number of bits of the encoded data to the length N', when N' is smaller than or equal to M.

3. The encoder according to claim 1, wherein the plurality of bit indices are stored in a look-up table of the memory.

4. The encoder according to claim 1, wherein the processor is configured to reduce the number of bits of the encoded data to the length N' by puncturing the encoded data of length N.

5. The encoder according to claim 4, wherein the plurality of bit indices comprise the set of N frozen bit indices and wherein the retrieved at least one subset of the plurality of bit indices comprise the first N−K frozen bit indices of the set of N frozen bit indices.

6. The encoder according to claim 5, wherein the plurality of bit indices further comprise the set of N/2 puncturing bit indices and wherein the retrieved subset of the plurality of bit indices further comprise the first P puncturing bit indices of the set of N/2 puncturing bit indices, wherein P=N−N', and the processor is configured to reduce the number of bits of the encoded data to the length N' by puncturing the bits of the encoded data of length N identified by the first P puncturing bit indices of the set of N/2 puncturing bit indices.

7. The encoder according to claim 1, wherein the processor is configured to reduce the length of the encoded data to the length N' by shortening the encoded data of length N.

8. The encoder according to claim 7, wherein the plurality of bit indices comprise the set of N frozen bit indices, and the retrieved subset of the plurality of bit indices comprise the first N−K−S frozen bit indices of the set of N frozen bit indices, wherein S=N−N'.

9. The encoder according to claim 8, wherein the plurality of bit indices further comprise the set of N/2 shortening bit indices, and the retrieved subset of the plurality of bit indices further comprise the first S shortening bit indices of the set of N/2 shortening bit indices, and the processor is configured to reduce the length of the encoded data to the length N' by shortening the bits of the encoded data of length N identified by the first S shortening bit indices of the set of N/2 shortening bit indices.

10. The encoder according to claim 1, wherein the plurality of bit indices comprise (a) a first set of N frozen bit indices related to the set of N/2 puncturing bit indices and (b) a second set of N frozen bit indices related to the set of N/2 shortening bit indices.

11. A method for encoding K information bits into a code word of length N' on the basis of a polar code of length N, wherein N is a power of 2 and greater than or equal to N', the method comprising:
    storing a plurality of bit indices in a memory, wherein the plurality of bit indices comprise (a) a set of N frozen bit indices associated with the polar code of length N, (b) a set of N/2 puncturing bit indices, and/or (c) a set of N/2 shortening bit indices;
    retrieving at least a subset of the plurality of bit indices from the memory;
    encoding the K information bits using the polar code of length N for obtaining encoded data of length N; and
    reducing the number of bits of the encoded data to the length N' for obtaining the code word of length N'.

12. A decoder for decoding K information bits encoded in a code word of length N' on the basis of a polar code of length N, wherein N is a power of 2 and greater than or equal to N', the decoder comprising:
    a memory storing a plurality of bit indices, wherein the plurality of bit indices comprise (a) a set of N frozen bit indices associated with the polar code of length N, (b) a set of N/2 puncturing bit indices, and/or (c) a set of N/2 shortening bit indices;
    a processor configured to retrieve at least a subset of the plurality of bit indices from the memory and to decode the K information bits encoded in the code word of length N' using the polar code of length N for obtaining decoded data of dimension K.

13. The decoder according to claim 12, wherein the plurality of bit indices further comprise (a) a set of M frozen bit indices associated with a polar code of length M, (b) a set of M/2 puncturing bit indices, and/or (c) a set of M/2 shortening bit indices, wherein M is a power of 2 and smaller than N, and
    wherein the processor is configured to decode the K information bits encoded in the code word of length N' using the polar code of length M, when N' is smaller than or equal to M.

14. The decoder according to claim 12, wherein the plurality of bit indices are stored in a look-up table of the memory.

15. A method for decoding K information bits encoded in a code word of length N' on the basis of a polar code of length N, wherein N is a power of 2 and greater than or equal to N', the method comprising:
   storing a plurality of bit indices in a memory, wherein the plurality of bit indices comprise (a) a set of N frozen bit indices associated with the polar code of length N, (b) a set of N/2 puncturing bit indices, and/or (c) a set of N/2 shortening bit indices;
   retrieving at least a subset of the plurality of bit indices from the memory; and
   decoding the K information bits encoded in the code word of length N' using the polar code of length N for obtaining decoded data of dimension K.

16. The method according to claim 11, wherein the plurality of bit indices further comprise (a) a set of M frozen bit indices associated with a polar code of length M, (b) a set of M/2 puncturing bit indices, and/or (c) a set of M/2 shortening bit indices, wherein M is a power of 2 and smaller than N, and
   wherein the method further comprises: encoding the K information bits using the polar code of length M and to reduce the number of bits of the encoded data to the length N', when N' is smaller than or equal to M.

17. The method according to claim 11, wherein the plurality of bit indices are stored in a look-up table of the memory.

18. The method according to claim 11, further comprising:
   reducing the number of bits of the encoded data to the length N' by puncturing the encoded data of length N.

19. The method according to claim 15, wherein the plurality of bit indices further comprise (a) a set of M frozen bit indices associated with a polar code of length M, (b) a set of M/2 puncturing bit indices, and/or (c) a set of M/2 shortening bit indices, wherein M is a power of 2 and smaller than N, and
   wherein the method further comprises: decoding the K information bits encoded in the code word of length N' using the polar code of length M, when N' is smaller than or equal to M.

20. The method according to claim 15, wherein the plurality of bit indices are stored in a look-up table of the memory.

\* \* \* \* \*